United States Patent
Lin et al.

(10) Patent No.: US 11,557,536 B2
(45) Date of Patent: Jan. 17, 2023

(54) INTEGRATED CIRCUITS (IC'S) WITH ELECTRO-MIGRATION (EM)—RESISTANT SEGMENTS IN AN INTERCONNECT LEVEL

(71) Applicant: Intel Corporation, Santa Clara, CA (US)

(72) Inventors: Kevin Lin, Beaverton, OR (US); Christopher J. Jezewski, Portland, OR (US); Manish Chandhok, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 123 days.

(21) Appl. No.: 16/649,901

(22) PCT Filed: Dec. 27, 2017

(86) PCT No.: PCT/US2017/068590
§ 371 (c)(1),
(2) Date: Mar. 23, 2020

(87) PCT Pub. No.: WO2019/132899
PCT Pub. Date: Jul. 4, 2019

(65) Prior Publication Data
US 2020/0279806 A1    Sep. 3, 2020

(51) Int. Cl.
*H01L 23/522*    (2006.01)
*H01L 21/768*    (2006.01)

(52) U.S. Cl.
CPC .... *H01L 23/5226* (2013.01); *H01L 21/76805* (2013.01); *H01L 21/76816* (2013.01); *H01L 21/76847* (2013.01)

(58) Field of Classification Search
CPC ........... H01L 23/5226; H01L 21/76805; H01L 21/76816; H01L 21/76847
See application file for complete search history.

(56) References Cited

U.S. PATENT DOCUMENTS 5,285,017 A    2/1994    Gardner
5,439,731 A *  8/1995    Li ...................... H01L 23/5283
                                                        428/209

(Continued)

FOREIGN PATENT DOCUMENTS

WO    2017111924    6/2017
WO    2017204820    11/2017

OTHER PUBLICATIONS

International Search Report and Written Opinion from PCT/US2017/068590 dated Sep. 27, 2018, 14 pgs.

(Continued)

*Primary Examiner* — Shahed Ahmed
*Assistant Examiner* — Vicki B. Booker
(74) *Attorney, Agent, or Firm* — Essential Patents Group, LLP

(57) ABSTRACT

Integrated circuit (IC) interconnect lines having improved electromigration resistance. Multi-patterning may be employed to define a first mask pattern. The first mask pattern may be backfilled and further patterned based on a second mask layer through a process-based selective occlusion of openings defined in the second mask layer that are below a threshold minimum lateral width. Portions of material underlying openings defined in the second mask layer that exceed the threshold are removed. First trenches in an underlying dielectric material layer may be etched based on a union of the remainder of the first mask layer and the partially occluded second mask layer. The first trenches may then be backfilled with a first conductive material to form first line segments. Additional trenches in the underlayer may then be etched and backfilled with a second conductive material to form second line segments that are coupled together by the first line segments.

20 Claims, 10 Drawing Sheets

(56) References Cited

U.S. PATENT DOCUMENTS

| | | | |
|---|---|---|---|
| 5,935,868 A | 8/1999 | Fang et al. | |
| 5,950,107 A | 9/1999 | Huff et al. | |
| 6,191,481 B1 * | 2/2001 | Bothra | H01L 23/528 257/734 |
| 6,245,996 B1 * | 6/2001 | Atakov | H01L 23/5226 174/250 |
| 9,391,019 B2 | 7/2016 | Kobrinsky et al. | |
| 9,786,603 B1 | 10/2017 | Clavenger et al. | |
| 10,083,863 B1 | 9/2018 | Hsieh et al. | |
| 10,141,330 B1 | 11/2018 | Lindsay et al. | |
| 2004/0071991 A1 | 4/2004 | Atakov et al. | |
| 2006/0171098 A1 | 8/2006 | Won | |
| 2007/0216030 A1 | 9/2007 | Schindler et al. | |
| 2009/0020744 A1 | 1/2009 | Mizukami et al. | |
| 2009/0053892 A1 | 2/2009 | Meyer et al. | |
| 2009/0212350 A1 | 8/2009 | Kidoh et al. | |
| 2009/0224365 A1 | 9/2009 | Remmel et al. | |
| 2010/0038782 A1 | 2/2010 | Yang et al. | |
| 2010/0133599 A1 | 6/2010 | Chae et al. | |
| 2010/0164116 A1 | 7/2010 | Li et al. | |
| 2010/0224962 A1 | 9/2010 | Kim | |
| 2011/0006645 A1 | 1/2011 | Chen et al. | |
| 2011/0032659 A1 | 2/2011 | Dunn et al. | |
| 2011/0032660 A1 | 2/2011 | Dunn et al. | |
| 2012/0058640 A1 | 3/2012 | Kim et al. | |
| 2012/0156881 A1 | 6/2012 | Haffner | |
| 2012/0181701 A1 | 7/2012 | Chen et al. | |
| 2012/0225550 A1 | 9/2012 | Blatchford | |
| 2012/0306090 A1 | 12/2012 | Smith et al. | |
| 2013/0105948 A1 | 5/2013 | Kewley | |
| 2013/0234216 A1 | 9/2013 | Chou et al. | |
| 2014/0027922 A1 | 1/2014 | Uzoh | |
| 2014/0054535 A1 | 2/2014 | Chen et al. | |
| 2014/0248773 A1 | 9/2014 | Tsai | |
| 2014/0264740 A1 | 9/2014 | Stribley | |
| 2015/0064916 A1 | 3/2015 | Shieh et al. | |
| 2015/0108607 A1 | 4/2015 | Chen et al. | |
| 2015/0221716 A1 | 8/2015 | Jakushokas et al. | |
| 2015/0318263 A1 | 11/2015 | Yu et al. | |
| 2016/0071799 A1 | 3/2016 | Hsieh et al. | |
| 2016/0099209 A1 | 4/2016 | Nishihara | |
| 2016/0204102 A1 | 7/2016 | Chen | |
| 2016/0218059 A1 | 7/2016 | Nakada et al. | |
| 2016/0225666 A1 | 8/2016 | Bouche et al. | |
| 2016/0372369 A1 | 12/2016 | Shaviv | |
| 2017/0110402 A1 | 4/2017 | Smith et al. | |
| 2017/0352585 A1 | 12/2017 | Burns et al. | |
| 2018/0096934 A1 | 4/2018 | Siew et al. | |
| 2018/0350611 A1 | 12/2018 | Kim et al. | |
| 2019/0096759 A1 | 3/2019 | Chang et al. | |
| 2019/0139887 A1 | 5/2019 | Lin et al. | |
| 2019/0273021 A1 | 9/2019 | Ohashi | |
| 2019/0287987 A1 | 9/2019 | Oshiki | |
| 2019/0371898 A1 | 12/2019 | Huang | |
| 2020/0006261 A1 | 1/2020 | Lin | |
| 2020/0013900 A1 | 1/2020 | Carr et al. | |
| 2020/0066521 A1 | 2/2020 | Lin et al. | |
| 2020/0075618 A1 | 3/2020 | Oike | |
| 2020/0152502 A1 | 5/2020 | Hsu | |
| 2020/0194376 A1 | 6/2020 | Naylor et al. | |
| 2020/0219804 A1 | 7/2020 | Jezewski et al. | |
| 2020/0227348 A1 | 7/2020 | Lin | |
| 2020/0303246 A1 | 9/2020 | Varghese et al. | |
| 2021/0118851 A1 | 4/2021 | Richards et al. | |

OTHER PUBLICATIONS

International Preliminary Report on Patentability from PCT/US2017/068590 dated Jul. 9, 2020, 11 pgs.

* cited by examiner

INTEGRATED CIRCUITS (IC'S) WITH ELECTRO-MIGRATION (EM)—RESISTANT SEGMENTS IN AN INTERCONNECT LEVEL

CLAIM OF PRIORITY

This Application is a National Stage Entry of, and claims priority to, PCT Application No. PCT/US2017/068590, filed on Dec. 27, 2017 and titled "INTEGRATED CIRCUITS (IC'S) WITH ELECTROMIGRATION (EM)-RESISTANT SEGMENTS IN AN INTERCONNECT LEVEL", which is incorporated by reference in its entirety for all purposes.

BACKGROUND

Device density in integrated circuits (ICs) continues to increase. Integrated circuits (e.g., microprocessors, chipset components, graphics chips, memory chips, optical chips, etc.) commonly include electrically conductive traces, separate layers of which are coupled together by vias. To date, conductive traces are typically formed in trenches defined by a lithographic process in which a photoresist layer may be spin-coated over a dielectric layer. The photoresist layer may be exposed to radiation through a patterned mask, and the exposed photoresist developed in order to form an opening. Next, an opening for the trench may be etched in the dielectric layer by using the photoresist layer as an etch mask. This opening is referred to as a trench. Finally, the trench may be back filled with one or more metals or other conductive materials to form a conductive trace embedded within the dielectric layer.

One measure of the size of a trace is the critical dimension (CD). One measure of the spacing of a set of traces is their pitch. In the past, the sizes and the spacing of traces have progressively decreased. However, when patterning extremely small conductive line ends having extremely small pitches with lithographic processes, several challenges present themselves, particularly when the pitches are ~70 nanometers (nm), or less, and/or when the critical dimensions of the line ends are ~35 nm, or less. One challenge is that electromigration failures become more likely as the cross-sectional area of interconnect lines decreases. Techniques to improve an interconnect line's resistance to electromigration failure are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
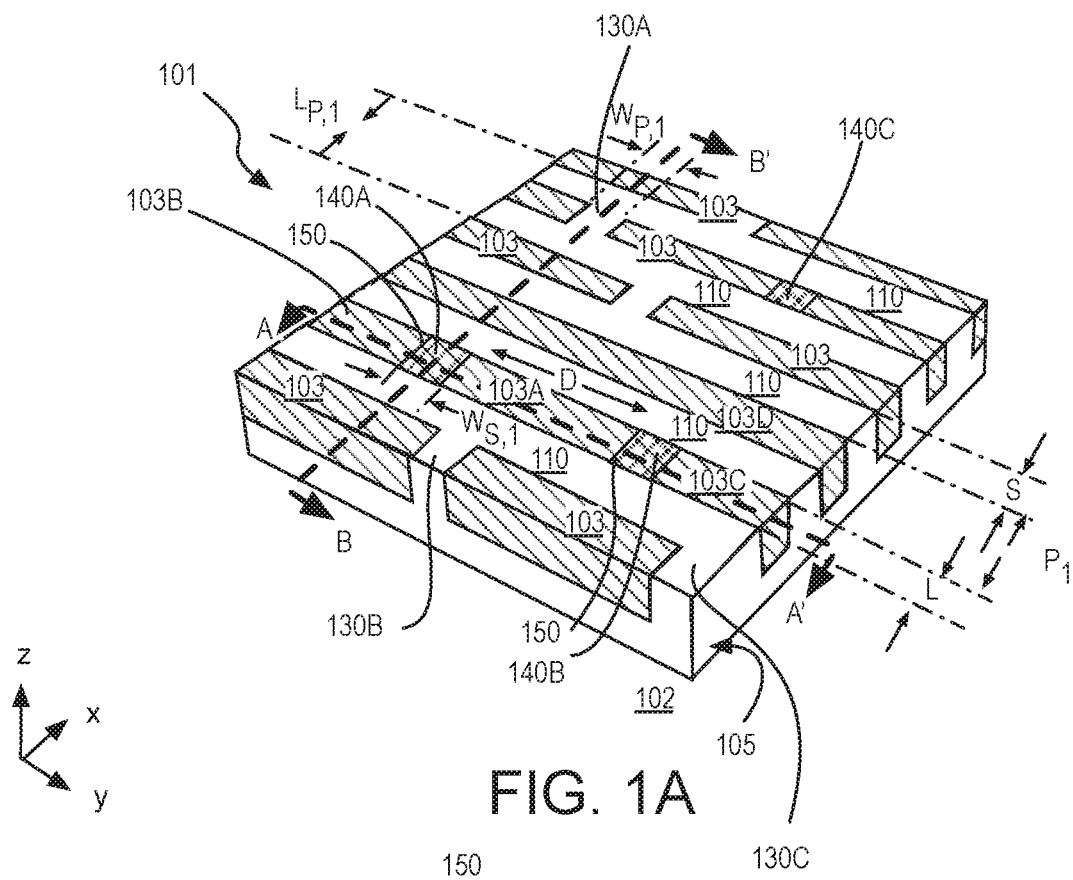
FIG. 1A is an isometric illustration of a portion of an IC structure including an IC interconnect level having interconnect line segments coupled through electromigration-resistant staples, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between." and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures associated with interconnect line staples that improve electromigration resistance of the interconnect line are described below. Methods and architectures associated with electromigration-resistance interconnect line "staples" that bridge two segments of a single conductive interconnect trace are further described below. A "staple" is a conductive interconnect line segment that couples two adjacent, collinear conductive segments of an interconnect line or of a given interconnect level, bridging the collinear line segments with one or more conductive material. The staple and/or the collinear line segments joined by the staple may include one conductive material having superior electromigration resistance than another conductive material. The combination of staples and collinear line segments form a structure having a periodic composition that limits the continuous length of one conductive material that would otherwise extend over distances where electromigration would more readily occur in absence of the interfaces and/or material changes introduced by the staple, and/or the stapling process. In accordance with some embodiments, formation of the staples is selective and therefore only a subset of interconnect lines most susceptible to electromigration failures (e.g., those subjected to high currents during IC operation) may include the staples. Other interconnect lines less susceptible to electromigration failures (e.g., those coupled to only to transistor gate electrodes) may benefit from lower line resistance possible in the absence of the staples. In accordance with exemplary embodiments, the interconnect line staples are present in-plane, or in the same interconnect level, as the collinear line segments that are bridged by the staple. As described further below, staples may be advantageously defined with a single mask level that can also be employed to define breaks or plugs in the conductive interconnect lines. Embodiments herein may therefore offer improved electromigration resistance without increasing mask count.

In accordance with some embodiments described further below, a lithographic plate or reticle that prints photoresist mask structures in a photoresist at a given pitch (P) may be employed, for example with a pitch-retaining patterning technique, or a pitch-splitting patterning technique, to define line (trench) widths and spaces between line lengths. Exemplary pitch-splitting techniques include pitch halving (P/2), or pitch quartering (P/4) hardmask patterning technique, either of which may be employed to pattern a first mask layer. Another masking operation then defines plugs and staples, which either bridge adjacent ones of the first mask layer lines, or facilitate segmentation of a given space between adjacent ones of the first mask layer lines, respectively. The resulting segmented lines may and joined spaces then be translated into a trench pattern in an underlying material layer (e.g., any suitable dielectric), which may then be backfilled with conductive material multiple times to form conductive trace segments having different compositions along the length of a trace. The plugs enable a complex damascene-type interconnect structure to be fabricated from a simple line pattern. Because of the fabrication technique, the interconnect structures in accordance with embodiments herein can be fabricated at the scaled-down geometries achievable with pitch-splitting, multiple patterning techniques. Some exemplary embodiments described below illustrate the use of one-dimensional (1D) grating mask structures. A grating mask is advantageously amenable to both direct patterning and pitch-splitting techniques (e.g., P/2 and P/4 patterning techniques). The exemplary embodiments described below illustrate the fabrication of 1D discontinuous conductive traces from two masking layers where one of the masking layers is a 1D grating and the other is a 2D mask that defines polygons of arbitrary shape and lateral dimensions. An additional interconnect level can then be employed to join adjacent ones of the interconnect lines, forming 2D interconnect routing, if desired. One or more of the features described below may be practiced in accordance with embodiments further described herein to arrive at interconnect structures having one or more of the structural features described herein.

Some exemplary embodiments described below illustrate structural features indicative of fabrication processes that apply the principles taught herein. Hence, while various mask structures described below may be ephemeral, final structures in the IC that serve as a lasting fingerprint of the fabrication process are highlighted. For example, dielectric plugs fabricated as described below may have first lateral widths or lengths in a first dimension that are discrete, integer functions of line spacing and the line width of the interconnect lines terminated by the plugs. The dielectric plugs may further have second lateral widths or lengths in a second dimension, orthogonal to the first dimension, that are non-discrete. Conductive staples and surrounding conductive line segments fabricated as described below may have first lateral widths or lengths in the first dimension that are substantially equal so that the addition of staples does not incur a loss of interconnect line pitch. The conductive staples may further have second lateral widths or lengths in the second dimension that are equal or unequal to the second lateral widths or lengths of the plugs. The staples may have second lateral widths or lengths that are larger than the second lateral widths or lengths of the plugs by an arbitrary, non-discrete, amount. The differences in the lateral dimensions between plugs and staples are further indicative of the single-mask level technique described herein. As described further below, plugs may be fabricated from a polygon smaller than a threshold lateral length and/or width, while staples may be fabricated from a polygon that is larger than the threshold lateral dimension.

Figure 1B:
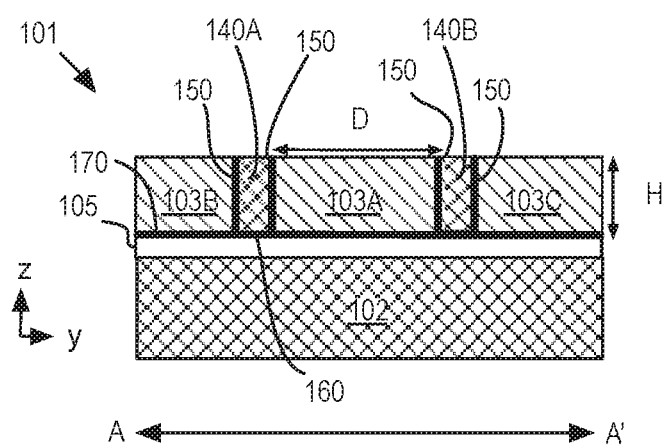
FIG. 1B is a cross-sectional illustration of a portion of an IC structure including an IC interconnect level having interconnect line segments coupled through electromigration-resistant staples, in accordance with some embodiments.

FIG. 1 is a perspective view of a portion of an IC including an IC interconnect structure 101 that has conductive line segments 103 over a dielectric material 105. Conductive line segments 103 are in a plane (e.g. x-y dimension) of a single interconnect level. IC interconnect structure 101 may be a portion of any IC interconnect level over any substrate 102. For example IC interconnect structure 101 may be a first interconnect level (e.g., metal 0), or a higher interconnect level (e.g., metal 1-7). Substrate 102 may, for example, further includes active devices, such as, but not limited to transistors (e.g., CMOS field effect transistors) that have terminals coupled to various ones of the conductive line segments 103. Within interconnect structure 101, line segments 103 extend lengthwise in a first dimension (e.g., in y-dimension). In exemplary embodiments, line segments 103 are parallel and may be considered a grating modified with line segment deletions or breaks. Line segments 103 may be of any conductive material. For example, line segments 103 may include one or more metal (e.g., Ta, Ti, W, Cu, Al, Ru, etc.) or doped semiconductor (e.g., polysilicon, etc.). In some exemplary embodiments, line segments 103 include a liner of a first conductive material (e.g., including Ta) and a fill of a second conductive material (e.g., including Cu), as described further below in the context of FIG. 1B. As further shown in FIG. 1A, line segments 103 may form an array of any number of adjacent, non-collinear electrical traces. An intervening dielectric material 110 separates sidewalls of adjacent line segments 103. Dielectric material 110 may have the same composition as dielectric material 105 that is below line segments 103. Dielectric material 110 and/or dielectric material 105 may both be interlayer dielectric (ILD) materials, as one example. Alternatively, dielectric material 105 may be a shallow trench isolation (STI) material, in another example. Dielectric material 110 and dielectric material 105 may each be any material known to provide sufficient electrical isolation between line segments 103, such as, but not limited to SiC, SiN, SiCN, SiO, SiON, SiOC, HSQ, MSQ, or the like. For these compounds, the group IV constituent might also be replaced, (e.g., germanium nitrides, metal germanides, etc.). Various light and transition metal oxides (e.g., AlOx, HfOx, ZrOx, TiOx) and their silicates are also possible.

The transverse width (e.g., x-axis) of line segments 103 may vary with technology node. In some embodiments line segments 103 have a pitch $P_1$ of 80 nanometer (nm), or less. Pitch $P_1$ may be substantially constant over a portion of, or an entirety of, an IC area. Pitch $P_1$ is equal to line width L summed with space width S. Line width L may be substantially constant over a portion of, or an entirety of, an IC area. In some embodiments where pitch $P_1$ is 80 nm, or less, line width L is 40 nm, or less. For example, line width L may be 5-40 nm. Dielectric material 110 extends lengthwise in the first direction (e.g., in y-dimension) with the transverse width of dielectric material 110 being equal to space width S. Space width S may be substantially constant over a portion of, or an entirety of, an IC area. In exemplary embodiments where pitch $P_1$ is 80 nm, or less, space width S is 40 nm, or less. In some embodiments, space width S is unequal to line width L. For example, space width S may be larger (e.g., at least 5 nm) than line width L (e.g., no more than 8 nm). Alternatively, space width S may be smaller (e.g., no more than 8 nm) than line width L (e.g., at least 5 nm). In other embodiments, space width S is substantially equal to line width L.

Top and sectional views of dielectric plugs 130A. 130B and 130C are further illustrated in FIG. 1A. Plug 130A spans the width between adjacent lines of dielectric material 110 in the second dimension of the interconnect plane (e.g., x-dimension). Because plugs 130 may have the same composition as dielectric material 110 (e.g., including oxygen and silicon), there may be no material or microstructural interface (i.e., a homogenous material) associated with plug 130A. Hence, the geometry, and/or lateral dimensions, and/or locations of plugs 130 relative to other structures may be the primary indicator(s) of the fabrication process.

In the first dimension of the interconnect plane, plug 130A has a width at least equal to the conductive line width L. In this dimension, plug 130A bridges two adjacent lines of dielectric material 110 such that adjacent non-collinear conductive line segments 103 are spaced apart by a plug length $L_{P,1}$ that is an integer multiple (e.g., N) of the space width S summed with a smaller integer multiple (e.g., N−1) of the line width L. More specifically, plug length $L_{P,1}$=2S+L. All of plugs 130 (e.g., 130A, 130B, 130C) within a partial area, or over an entire area, of an IC may have a plug length $L_P$ that satisfies the function (N)S+(N−1)L. In the other dimension (e.g., y-dimension), plug 130A separates ends of collinear line segments 103 by a plug width $W_{P,1}$. Unlike $L_{P,1}$ that is discretized by the fixed line and space width of line segments 103, plug width $W_{P,1}$ is at least equal to the space width S, but may otherwise vary without constraint.

FIG. 1A further illustrates a top view of supplemental line segments or "staples" 140A, 140B and 140C. Line segments 140A, 140B alternate with line segments 103A, 103B and 103C. Line segments 140A. 140B are therefore in the same plane or interconnect level as segments 103A, 103B and 103C. Line segment 140C is an alternate segments between two other segments of another conductive line 103. Like line segments 103A-103C, line segments 140A-140C may also be of any conductive material suitable for IC interconnects. For example, line segments 140A-C may include one or more metal (e.g., Ta, Ti, W, Cu, Al, Ru, etc.) or doped semiconductor (e.g., polysilicon, etc). Line segments 140A-140C have a length in the first dimension of the interconnect plane (e.g., x-dimension) that is substantially equal to the transverse line width L. Line segment 140A intersects and bridges the two collinear line segments 103A and 103B. Intervening line segment 140A is therefore between a first end of line segment 103A and an end of line segment 103B. Another line segment 140B intersects and bridges collinear conductive line segments 103A and 103C. Line segment 140B is therefore between a second end of line segment 103A and an end of line segment 103C. Line segments 140A-140C have an arbitrary staple width $W_{S,1}$ in the second dimension of the interconnect plane (e.g., y-dimension). In some embodiments, staple width $W_{S,1}$ is independent of plug width $W_{P,1}$. For example, staple width $W_{S,1}$ need not be a discrete integer multiple of plug width $W_{P,1}$.

In some advantageous embodiments, line segments 140 have a different composition than that of line segments 103. In some embodiments, line segments 140A-140C have a substantially homogenous composition. In some exemplary embodiments however, line segments 140A-140C include a liner having a first material composition, and a fill having a second material composition. In the illustrated example, a liner 150 defines a perimeter of line segments 140A, 140B, and/or line segments 103A. 103B, 103C. Hence, unlike dielectric plugs 130A-C, a material and/or microstructural interface associated with liner 150 delineates conductive line segments 140 from conductive line segments 103. Where no liner is present, the fill, or bulk material composition of a first subset of collinear line segments (e.g., 140A-C) is different than the material composition of a second subset of collinear line segments (e.g., 103A-C) that are joined together by the first subset of line segments.

Line segments 103 and line segments 140 combine into a conductive interconnect line having a periodic compositional variation that may be engineered, for example, to improve electromigration resistance of the interconnect line beyond what would be possible for an equivalent line length having compositional homogeneity. At least some portion of either of line segments 103 and the line segments 140 may include a material having a higher electromigration resistance than other materials present within either, or both, of the segments 103 and 140. In other words, the segmentation is such that a segmented interconnect line periodically includes a section of material having a higher electromigration activation energy than other sections abutting that section. In some embodiments, line segments 140 include a material associated with a higher electromigration activation energy than line segments 103. This material within line segments 140 may then be spaced apart by a distance D that is advantageously less than the Blech length associated with line segments 103. Typically, the Blech length is only a consideration in the design of electrical test (E-test) structures, with the Blech length being the minimum length for lines of an electromigration test structure. However, in accordance with embodiments herein the Blech length sets the maximum length of a single interconnect line segment that has ends abutted by the material of higher electromigration resistance. Many such segments may be joined together by intervening line segments having higher electromigration activation energy for an IC interconnect line of arbitrary total length. For the illustrated example, if line segments 103 are shorter than the Blech length, higher currents can be sustained through line segments 103 before suffering an electromigration-related failure.

In some other embodiments, at least some portion of line segments 103 is associated with a higher electromigration activation energy than line segments 140. Line segments 103 may then be spaced apart by a distance D that is advantageously less than the Blech length associated with line segments 140. In some embodiments, for example where liner 150 introduces the only compositional variation within a length of an interconnect line, liner 150 is the intervening line segment and the remainder of line segments 103 and 140, being of substantially the same composition, are dimensioned to have a length less than the Blech length (i.e., both line segments 103 and 140 separate liner 150 a distance D that is below the Blech length).

The electrical resistance of a given length of an interconnect line may be minimized for embodiments where line segments 140 and/or line segments 103 include liner 150, and only liner 150 is of a material having higher electrical resistance (and higher electromigration resistance). For example, liner 150 may include Ta. Ta, and alloys of Ta (e.g., TaN), can have high electromigration resistance. With line segment 103A is bracketed by line segments 140A and 140B, a liner 150 is present at two opposite ends of line segment 103A, forming a sidewall interface that extends across the entire current carrying cross-section of line segment 103A. Where the distance D between two liners 150 is less than the Blech length, higher current densities may be achieved within line segment 103A without suffering electromigration-related failures. Line segment 140A is also bracketed by line segments 103A and 103B, with liner 150 present at two opposite ends of line segment 140A, forming a sidewall interface that extends across the entire current carrying cross-section of line segment 140A. Where the distance D between two liners 150 is less than the Blech length, higher current densities may also be achieved within line segment 140A without suffering electromigration-related failures. Hence, in some embodiments where line segment 103A has a liner (e.g., including Ta) and a fill (e.g., including Cu), and line segments 140A, 140B also have a liner (e.g., including Ta) and a fill (e.g., including Cu), line segments 140A, 140B combine with line segments 103A, 103B. 103C to introduce a liner extending through the current carrying cross-section of an interconnect line. This liner at the ends of the segments 140 and 103 then functions an intervening line segment that introduces the periodic material composition variation down the length of a segmented line. In some such embodiments where width $W_{S,1}$ is approximately equal to distance D, the electrical resistance penalty of liner 150 may be minimized to be approximately equal to a length of an interconnect line divided by the Blech length associated with the fill metal employed in both segments 103 and 140 multiplied by the electrical resistance of liner 150, which is further a function of the liner composition and thickness.

In some further embodiments, an interconnect level includes both segmented conductive lines comprising periodically varying composition, and non-segmented conductive lines lacking such periodically varying composition. As described further below, the collinear segmentation a line may made selective and therefore not all lines of a given interconnect level need be segmented. Instead, in accordance with some embodiments, only those lines of an interconnect level that are to sustain current densities exceeding some predetermined threshold during IC operation are segmented, while the remaining lines of the interconnect level that need only sustain sub-threshold current densities during IC operation are not segmented. As such, electrical resistance of interconnect lines which do not need higher electromigration resistance can be minimized (i.e., will not suffer any resistance penalty associated with segmentation). For example, as shown in FIG. 1A, conductive line 103D, immediately adjacent to a segmented line having periodic compositional variation, has a length equal to a sum of line segments 103A, 103B, 103C, 140A and 140B. The length of line 103D therefore far exceeds distance D and may be well above the corresponding Blech length. Conductive line 103D may be coupled, for example, to a gate electrode of a transistor (not depicted) in substrate 102. A segmented conductive line that includes line segments 103A-103C and 140A-140B may be coupled, for example, to a source electrode of that transistor (or another transistor) in substrate 102. In this manner, parasitic electrical resistance for a lower current gate electrode within an IC may be minimized while electromigration resistance of a higher current source line within that IC is maximized.

FIG. 1B is a cross-sectional illustration of a portion of IC structure 101 along the A-A' line also illustrated in FIG. 1A, in accordance with some embodiments. As shown, the A-A line extends longitudinally through the segmented interconnect line that includes segments alternating from left to right as 103B, 140A, 103A, 140B, 103C. As further shown, between each segment is liner 150. In the illustrated embodiment, liner 150 has a thickness (along y-axis) that is greater than a thickness (along z-axis) of a liner 170 between a bottom of segments 103A, 103B and 103C and dielectric material 105. Liner 150 also has a thickness that is greater than a thickness of a liner 160 between a bottom of segments 140A, 140B and dielectric material 105. In some exemplary embodiments, liner 150 is equal to the summed thicknesses of liners 160 and 170. Where liners 160 and 170 have the same thickness, liner 150 is twice the thickness of liners 160, 170. In some further embodiments, where liners 160 and 170 are of the same composition (e.g., including Ta, and/or being TaN), liner 150 has the same composition as liners 160 and 170 (e.g., including Ta, and/or being TaN). Where liners 160 and 170 have different compositions, liner 150 may be a bi-layer comprising one layer having the composition of liner 160 and another layer having the composition of liner 170. Although line segments 140A and 140B are illustrated with different field lines to emphasize that their composition may be wholly different than that of line segments 103A-103C, in some embodiments line segments 140A, 140B, 103A, 103B, 103C all have the same composition (e.g., all including Cu, all including Ru, all including W, etc.).

In some embodiments, the vertical height H (e.g., along the z-axis) of line segments 103A, 103B and 130C are all substantially the same (i.e., within 10% of each other). In some further embodiments, the vertical height H of lines segments 140A and 140B are substantially the same. In the exemplary embodiment illustrated in FIG. 1B, the vertical height H is substantially the same for all line segments 103A, 103B, 103C, 140A and 140B. In other embodiments, the vertical height H of line segments 140A and 140B are approximately equal, but different from the vertical height H of line segments 103A, 103B and 103C. For example, the vertical height H of line segments 140A and 140B may be greater than the vertical height H of line segments 103A, 103B and 103C. Alternatively, the vertical height H of line segments 140A and 140B may be less than the vertical height H of line segments 103A, 103B and 103C.

Figure 2:
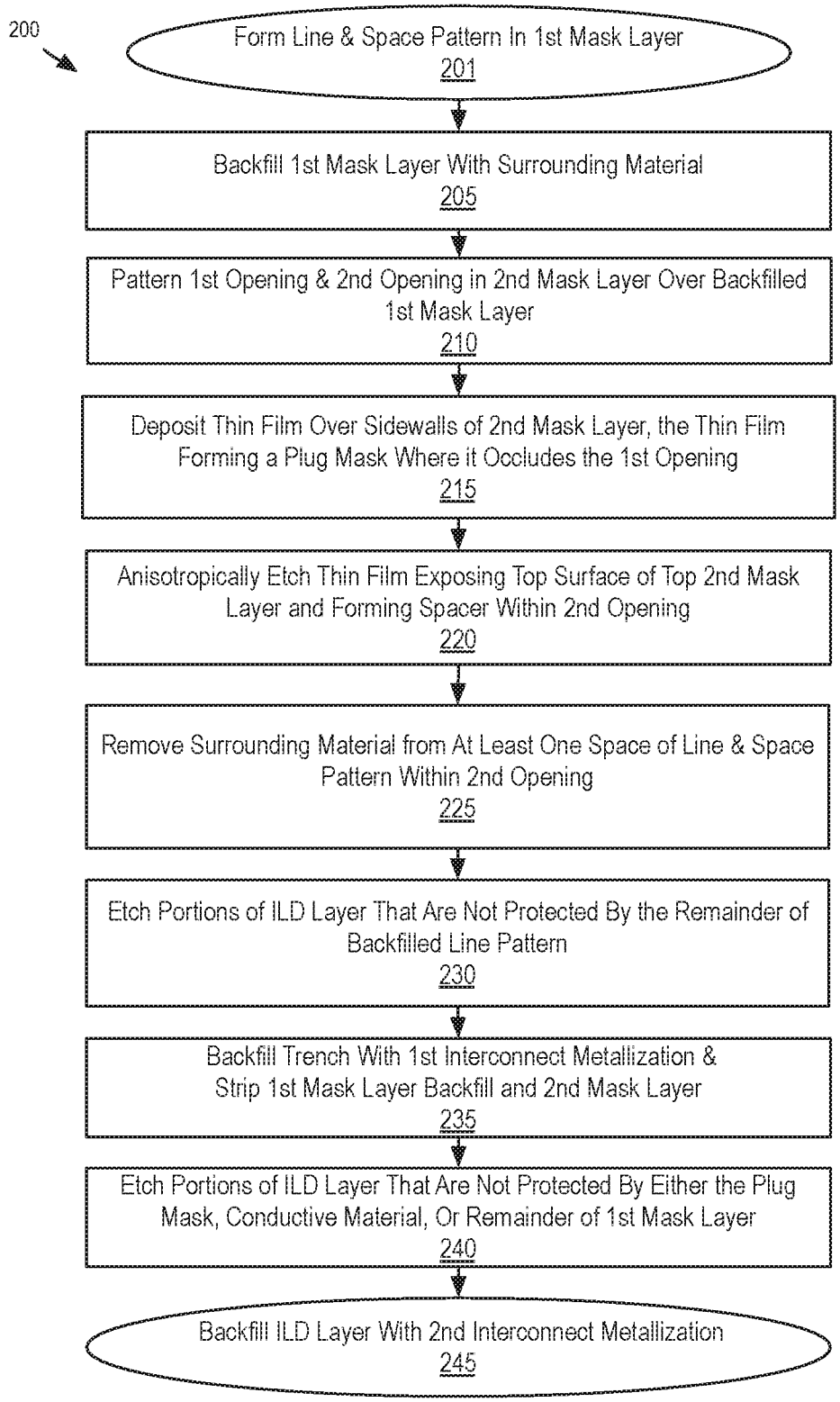
FIG. 2 is a flow diagram illustrating methods of fabricating an IC interconnect level that has interconnect line segments coupled through electromigration-resistant staples, in accordance with some embodiments.

A number of methods may be employed to fabricate the structures described in the context of interconnect structure 101. FIG. 2 is a flow diagram illustrating exemplary methods 200 for fabricating interconnect structures. In some embodiments, the interconnect structure 101 is fabricated according to methods 200. In methods 200, any mask structures having at least the threshold minimum lateral dimensions are ultimately translated into line segments (staples) that can merge multiple collinear line segments, while any mask structures that do not have at least the threshold minimum lateral dimensions are ultimately not translated into line segments and may instead generate a plug disrupting one or more line segment. FIG. 3-12 further illustrate views of an IC structure with an interconnect level evolving as operations in the methods 200 are practiced, in accordance with some exemplary embodiments.

Referring first to FIG. 2, methods 200 begin at operation 201 where a workpiece is received. The workpiece may be any known to be suitable for subsequent processing. In some exemplary embodiments, the workpiece is any known to be suitable for IC manufacture. In some such embodiments, the workpiece received at operation 201 includes a crystalline semiconductor substrate, such as but not limited to, a crystalline silicon wafer. The workpiece received at operation 201 includes a first mask layer having first mask structures, and one or more underlayers that are to be subsequently patterned based, at least in part, on the first mask structures. The first mask structures may be of any material suitable as a mask for a subsequent patterning process. The underlayers may be part of a handling substrate (e.g., crystalline semiconductor), and/or may include any suitable thin film(s) such as, but not limited to, one or more interlayer dielectric materials, metals, or semiconductor device layers.

Figure 3:
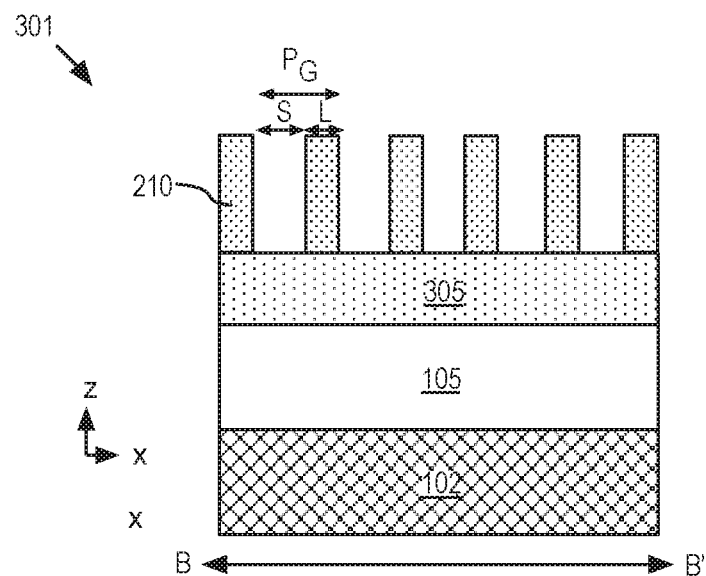
FIGS. 3, 4 and 5A are cross-sectional views of an IC interconnect level evolving as operations in the methods illustrated in FIG. 2 are practiced, in accordance with some embodiments.

FIG. 3 is an exemplary workpiece that is illustrated along the B-B' line also visible in FIG. 1A. As shown in FIG. 3, IC structure 301 includes first mask structures 210 over an unpatterned mask layer 305. Mask layer 305 is over dielectric material 105, and dielectric material 105 is over substrate 102. Mask materials suitable for mask structures 210 and mask layer 305 include carbon-based hardmask materials (CHM), silicon oxides (e.g., include silicon and oxygen), silicon nitrides (include silicon and nitrogen), silicon carbides (include silicon and carbon), carbon-doped oxides (include silicon, oxygen, carbon, and hydrogen). Other materials, including metals, such as, but not limited to, TiN (includes titanium and nitrogen), may also be employed. As described above, dielectric material 105 may be any dielectric material known to be suitable as an IC ILD (e.g., silicon oxides, carbon-doped oxides, other low-k materials, etc.).

The first mask structures received at operation 201 (FIG. 2) include structures of a first lateral width (i.e., in the plane of the workpiece). In some embodiments, the first mask structures have a "minimum lateral width" that is in name only (i.e. nominal), as individual mask structures with this minimum lateral width will not necessarily have exactly the same actual lateral widths. The first mask structures having the nominal minimum lateral width are of the same class of structures targeting some same minimum lateral width. In some embodiments, a vast majority, if not all, of the first mask structures have substantially the same actual minimum lateral width with some distribution about the target minimum lateral width as a result of process tolerances. As used herein, the qualifier "substantially" is employed in the recognition that manufacturing processes output a population characterized by some distribution statistics. In this context, a vast majority, if not all, of the first mask structures received at operation 201 have a target minimum lateral width+/−10% of that target minimum lateral width. These first mask structures may further have any lateral length to occupy any footprint over the workpiece, as embodiments herein are not limited in this context.

In the example shown in FIG. 3, mask structures 210 have a nominal lateral line width L and are spaced apart by a nominal space width S such that mask structures 210 are characterized by a nominal grating pitch $P_G$. Mask structures 210 may have been defined using any suitable techniques. For example, one or more lithographic processes (e.g., extreme UV) and/or subtractive processes (e.g., hardmask etching) and/or additive processes (e.g., thin film deposition) may have been practiced upstream to generate mask structures 210. In some embodiments, mask structures 210 are generated by a multi-patterning process, such as, but not limited to, pitch-quartering. Such techniques may achieve a target minimum lateral width of 5-40 nm, for example. Lateral spacing width S may be equal to, more than, or less than, the target lateral width of the structures. In some exemplary embodiments lateral space width S is 5-40 nm.

Figure 4:
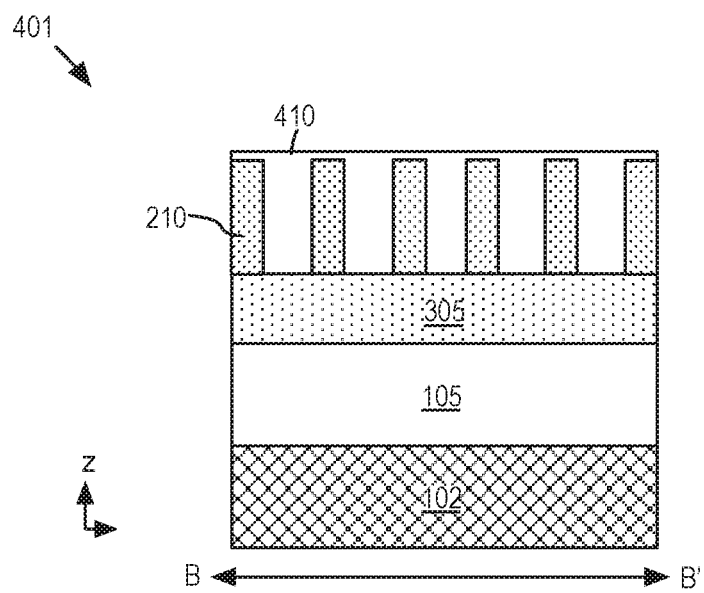

Returning to FIG. 2, methods 200 continue at operation 205 where a mask cap material is deposited over the first mask layer structures. The mask cap material may be any material known to be suitable as a mask material compatible with subsequent processing. The mask cap material may advantageously be of a composition that can be removed selectively (i.e., at a higher rate) relative to the first mask structures, and relative to the underlayer(s). The mask cap material may be deposited with any technique known to be suitable for the material. In some advantageous embodiments, the mask cap material is deposited with a super conformal process to completely backfill spaces between the first mask structures. Flowable depositions and spin-on techniques may be employed, for example. Optionally, the mask cap material may be subjected to further planarization processes (e.g., chemical-mechanical polish). In the example further illustrated in FIG. 4, structure 401 includes structure 301 and mask cap material 410, which backfills mask structures 210. In exemplary embodiments, mask cap material 410 is of a different composition than mask structures 210, with this difference providing a basis of etch selectivity between the two. Mask cap material 410 may be planarized with mask structures 210, or may encapsulate mask structures 210 as is illustrated in FIG. 4.

Returning to FIG. 2, methods 200 continue at operation 210 where first and second openings are patterned in a second mask layer over the first mask layer. All first openings have lateral dimensions smaller than a threshold. All second openings are larger than the first openings, having lateral dimensions that are at least larger than the threshold. The second mask layer may be any suitable photosensitive or hard mask material. If the second mask layer material is a hard mask, such as SiO, SiN, SiON, etc., it may be patterned according to any suitable technique. For example, openings may be etched into the second mask layer based on an overlying photosensitive material layer that has been lithographically patterned. In the example shown in FIG. 5A, IC structure 501 includes structure 401 and a mask material 505. An opening 510A and another opening 512A have been patterned into a mask material 505. Mask material 505 may have any composition, but in some advantageous embodiments, mask material 505 has a composition different than both mask structures 210 and mask cap material 410 to ensure some level of etch selectivity (e.g., mask material 505 can be etched selectively) relative to mask structures 210 and mask cap material 410.

Figure 5A:
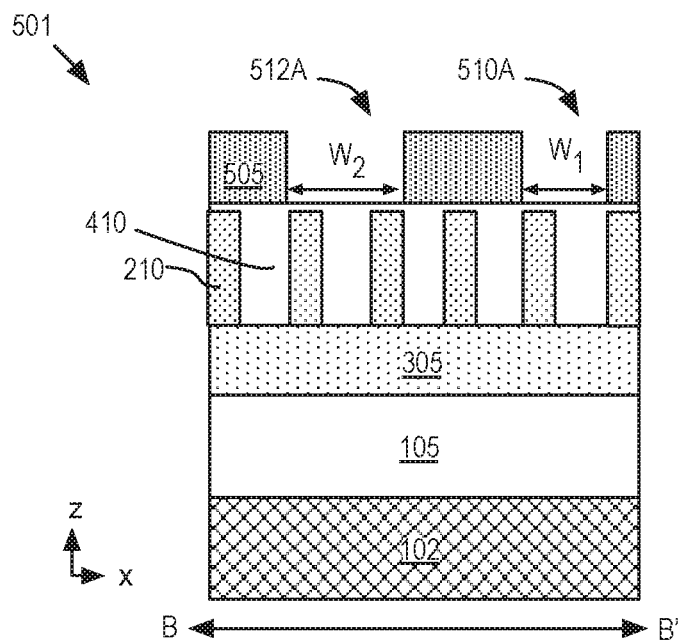
Figure 5B:
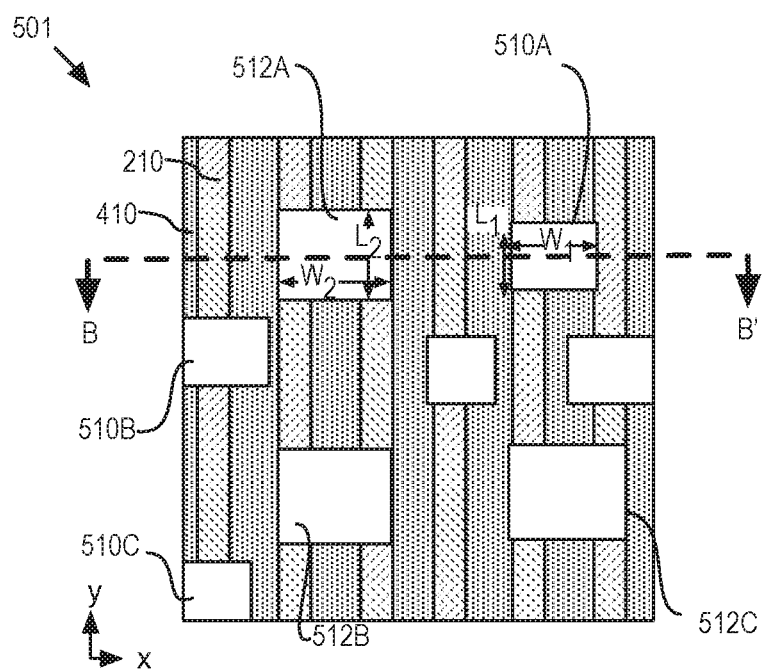
FIG. 5B is a plan view of an IC interconnect level after a selected operation in the methods illustrated in FIG. 2 is practiced, in accordance with some embodiments.

FIG. 5B, is a plan view of IC structure 501. The cross-sectional plane B-B' of FIG. 5A is further shown as a dashed line in FIG. 5B. Opening 510A has a lateral width $W_1$, while opening 512A has a lateral width $W_2$ that is larger than width $W_1$. Opening 510A exposes one mask structure 210 and one adjacent stripe of mask cap material 410. Opening 512A expose two adjacent mask structures 210 and one stripe of mask cap material 410 therebetween. As further shown in FIG. 5B, opening 510A has a lateral length $L_1$, while opening 512A has a lateral length $L_2$, that is larger than length $L_1$. In exemplary embodiments, at least one of $L_1$ and $W_1$ is smaller than a threshold lateral dimension, while both of $L_2$ and $W_2$ are larger than the threshold lateral dimension. As further shown in FIG. 5B, opening 510A is one of a plurality of openings 510. At least one of the length or width of all openings 510 (e.g., openings 510B, 510B and 510C) is smaller than the threshold lateral dimension. Opening 512A is likewise one of a plurality of openings 512. Both the length and width of all openings 512 (e.g., openings 512A, 512B and 512C) are larger than the threshold lateral dimension. Notably, openings 510 and 512 are 2D polygons (i.e., not 1D grating patterns), which may be sized independently from each other to have arbitrary lengths L and arbitrary widths W.

Methods 200 (FIG. 2) continue at operation 215 where a thin film is deposited over sidewalls of the openings that were patterned into the second mask layer. The thin film is advantageously deposited with a conformal deposition process such that the film thickness on sidewalls of the openings is well-controlled, and may be approximately (e.g., +/−10%) equal to a target thickness deposited over top surfaces of the second mask layer. The thin film is deposited to a thickness sufficient to fully occlude, or backfill, openings in the second mask layer dimensioned below the threshold dimension, but insufficient to fully occlude openings in the second mask layer dimensioned above the threshold dimension. The thin film deposition process at operation 215 may therefore be targeted to deposit a film having a thickness that is approximately half of the threshold dimension, or with some margin greater than half of the threshold dimension. For example, where the threshold opening dimension is 8 nm, a 4-5 nm thin film may be deposited at operation 215. The thin film deposited at operation 215 may be any material known to be suitable for such an application. For example, any dielectric material (e.g., metal oxide, CHM material, SiO, SiN, SiON, etc.), semiconductor material (e.g., Ge, SiGe, etc.), or metal (e.g., W) that can be conformally deposited (e.g., by chemical vapor deposition or atomic layer deposition) may be deposited at operation 215. In some advantageous embodiments, the thin film deposited at operation 215 has composition different than that of mask material 505.

Figure 6:
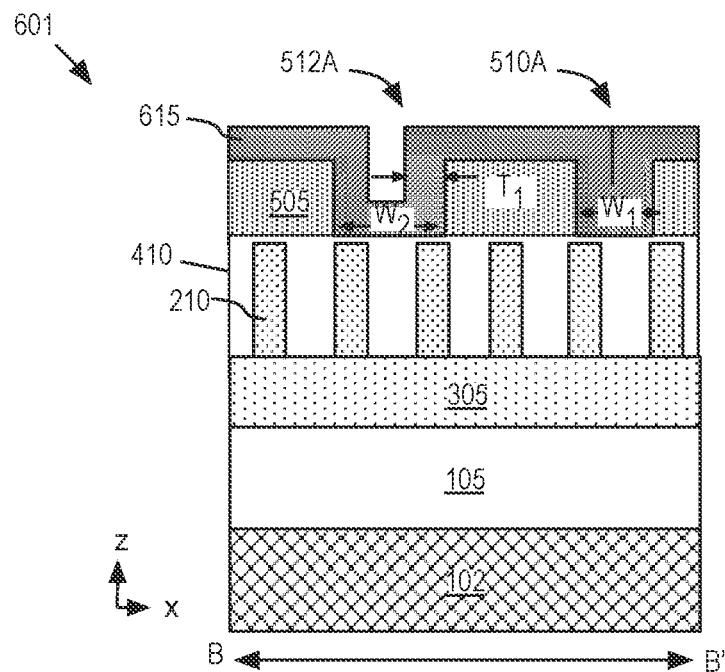
FIGS. 6, 7, 8, 9, 10, 11, 12 and 13 are cross-sectional views of an IC interconnect level evolving as operations in the methods illustrated in FIG. 2 are practiced, in accordance with some embodiments.
Figure 7:
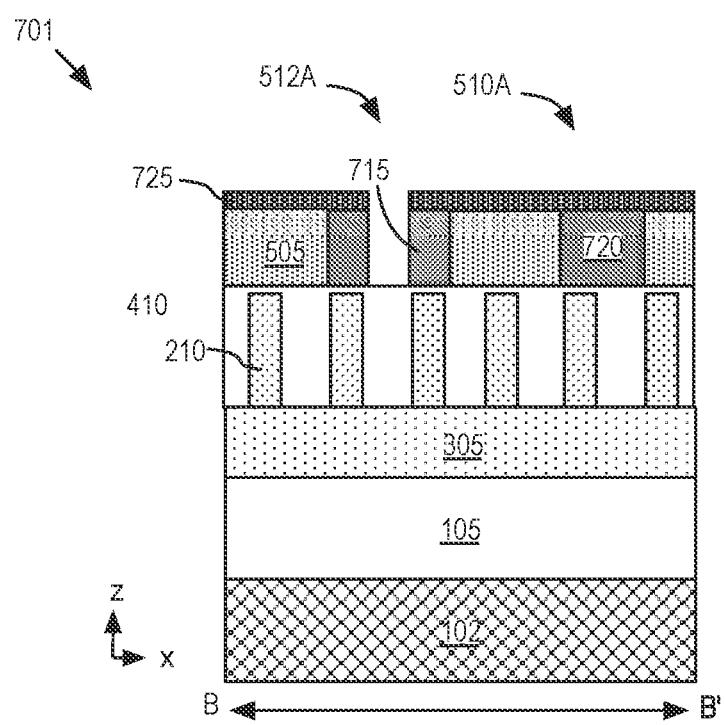

In the example further shown in FIG. 6, IC structure 601 includes IC structure 501, which is covered with a thin film material 615. Thin film material 615 has a sidewall thickness $T_1$, which is sufficient to fully occlude opening 510A, but merely reduces the lateral dimensions of opening 512A to a recess having a lateral dimension of approximately $W_2-2T_1$. Although not illustrated, thin film material 615 similarly reduces the lateral dimensions of openings 510A and 512A in the orthogonal dimension (e.g., y-dimension) such that if either lateral dimension is below the threshold, the opening will be fully occluded. Hence, although opening 510A has a width $W_1$ that is below the threshold for the sake of illustrating occlusion by thin film material 615, if the second dimension of opening 510A (e.g., $L_1$ in FIG. 5B) is below the threshold, opening 510A will be occluded even when width $W_1$ is any size. Likewise, although opening 512A has a width $W_2$ above the threshold, illustrating how thin film material 615 covers, but fails to completely fill-in, opening 512A. The second dimension of opening 512A (e.g., $L_2$ in FIG. 5B) is also above the threshold.

Returning to FIG. 2, methods 200 continue at operation 220 where the thin film deposited at operation 220 is etched to expose a top surface of the second mask layer as well as a bottom of the openings formed in the second mask layer. This etch may be anisotropic, in which case a residual spacer may be left along the sidewalls of the openings. Lateral dimensions of the residual spacer are dependent on the sidewall thickness of the thin film and the etch bias of the spacer-etchback process and may be tuned to achieve any suitable lateral spacer width desired. Any anisotropic etch process (e.g., dry plasma etch or develop, etc.) may be practiced as embodiments are not limited in this context. In the example further illustrated in FIG. 7, IC structure 701 includes IC structure 501 with the addition of sidewall spacers 715. As further illustrated, where thin film material 615 fully occluded opening 510A, the spacer etchback process leaves a plug mask 720 that still fully occludes opening 510A. The larger lateral dimensions of opening 512A however have allowed the spacer etchback to re-expose a top surface of mask structures 210 and any surrounding mask cap material 410. A lateral dimension (e.g., diameter) of opening 512A is however reduced by approximately twice the lateral width of spacer 715, which is, for example, some function of $T_1$.

Optionally, to recover the lateral width of opening 512A (e.g., $W_2$ in FIG. 6) additional processing may be performed to remove any residual spacer. For example, another thin film mask may be anisotropically deposited to cover top surfaces of the second mask material 505 and top surfaces of remaining thin film material 615 (and top surfaces of spacer 715) with a cap material 725. Cap material 725 may, for example, be deposited with a physical vapor deposition (PVD) or other deposition process with similar anisotropy such that little, if any, cap material 725 is deposited on sidewalls of spacer 715 (e.g., as a result of solid angle shadowing, etc.). Cap material 725 may have any composition (e.g., dielectric, semiconductor, metal) as embodiments are not limited in this respect beyond noting that it may be advantageous for the composition of cap material 725 to be different from that of spacer 715 so that portions spacer 715 left uncovered by cap material 725 may be selectively removed (e.g., etched isotropically). Following spacer removal, cap material 725 may then be deliberately stripped (e.g., with a selective etch), or simply allowed to erode during subsequent processing.

Alternatively, an isotropic etch process may be employed at operation 220. In such embodiments, thin film material 615 may be removed with an isotropic etch that targets the nominal thickness of the thin film (with suitable over etch) to expose surfaces that are covered with only the nominal cap layer thickness. During operation 220, cap layer material within the sub-threshold openings 510A is not completely removed because of the greater effective thickness of thin film mask material 615 within such openings. For super-threshold openings, sidewalls of the second mask pattern that are spaced apart by more than the threshold distance will be exposed. Hence, the original lateral width of the mask openings may be recovered for all those mask openings larger than the threshold lateral dimension. Regardless of the etchback technique employed at operation 220, the single patterning process employed to form openings of different dimensions in the second mask layer is leveraged to form both plug masks and openings that expose the underlying materials. Alignment between these plug masks and openings are therefore all perfectly (self)aligned to one another.

Returning to FIG. 2, methods 200 continue at operation 225 where at least some of the underlying mask cap material surround the first mask layers structures are removed by translating the openings in the second mask layer into the surrounding mask cap material. In the exemplary embodiments where the underlying mask structures comprise grating lines, at least some of the backfill material between the lines in the first mask layer that is located below the opening in the second mask layer is removed during operation 225, for example with a suitable selective and/or anisotropic etch. Then, at operation 230, portions of the underlying ILD layer that are not protected by the remainder of the backfilled line pattern are etched using any etch process suitable for the ILD composition.

Figure 8:
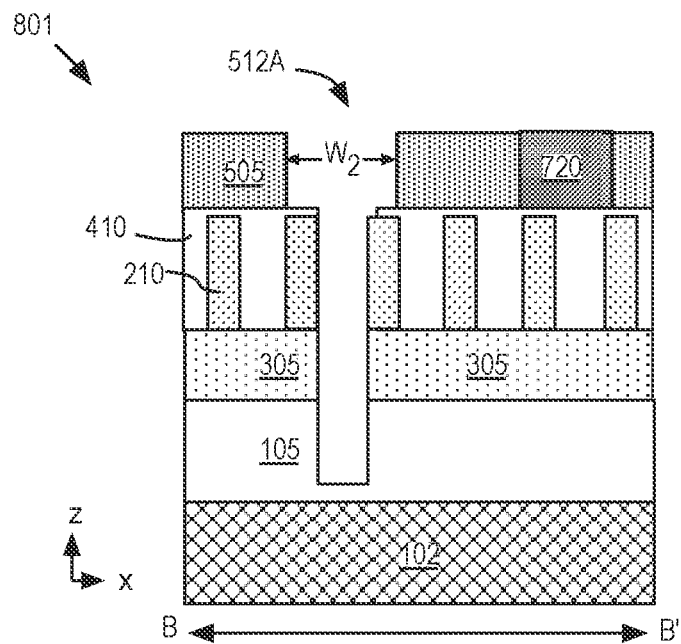
Figure 9:
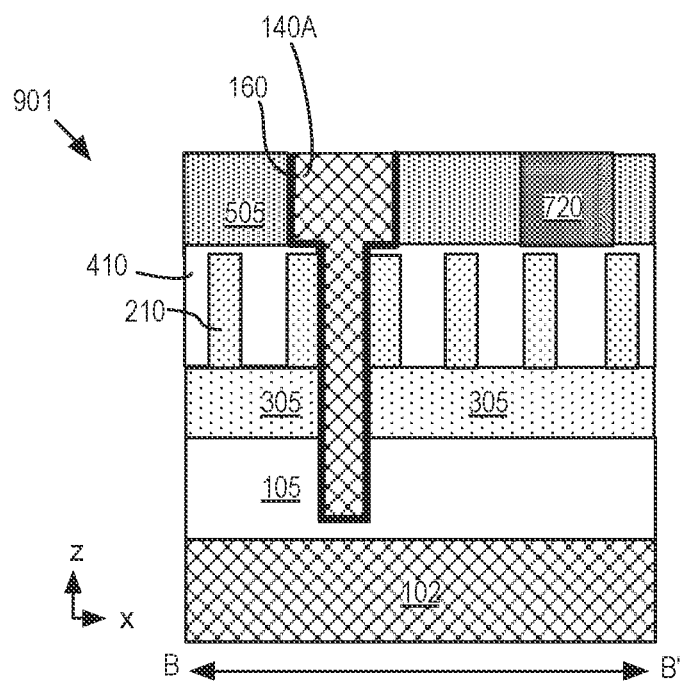

In the example further illustrated in FIG. 8, IC structure 801 includes IC structure 501 and plug mask 720. As shown, spacer 715 and cap material 725 has been removed such that opening 512A has regained the lateral width $W_2$. A portion of one stripe of mask cap material 410 that was exposed within opening 512A has been etched away, down through hardmask material 205 and into dielectric material 105. A union of the opening 512A and mask structure 210 has thus been patterned into dielectric material 105.

Returning to FIG. 2, methods 201 continue at operation 235 where the trench formed in the ILD material at operation 230 is backfilled with a first interconnect metallization to form discrete line segments. The second mask layer and remaining mask cap material may then be removed from between the lines of the first mask layer. The interconnect metallization deposited at operation 235 is for all first segments of interconnect lines within the interconnect level. One or more conductive materials may be deposited at operation 235. In the example illustrated in FIG. 9, liner 160 is first deposited along a bottom and sidewall of the trench within opening 512A. A fill metal 1103 is then deposited over liner 160 to complete line segment 140A. In some such embodiments, a Ta-based liner is deposited and Cu-based fill metal is plated over the Ta-based liner. In some other embodiments, a single homogenous material (e.g., Ru, W, etc.) is deposited during operation 235, in which case liner 160 would be absent.

Figure 10:
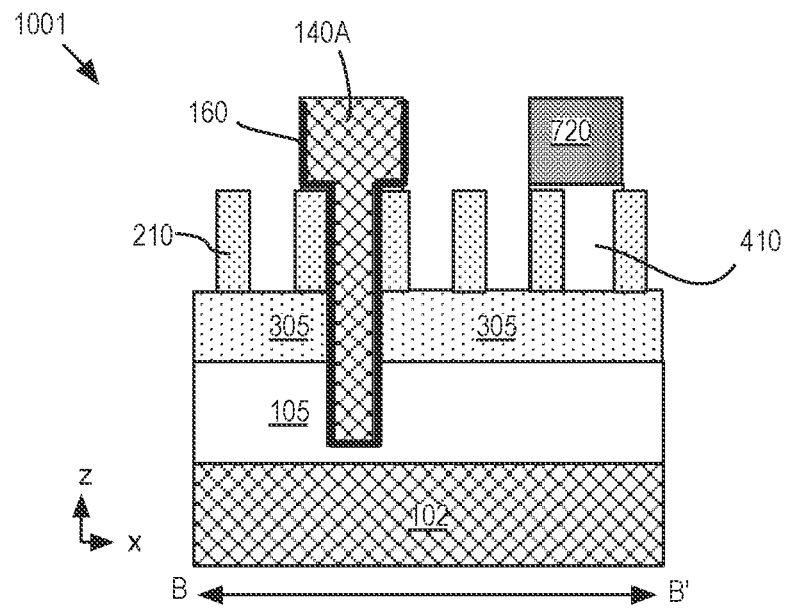
Figure 11:
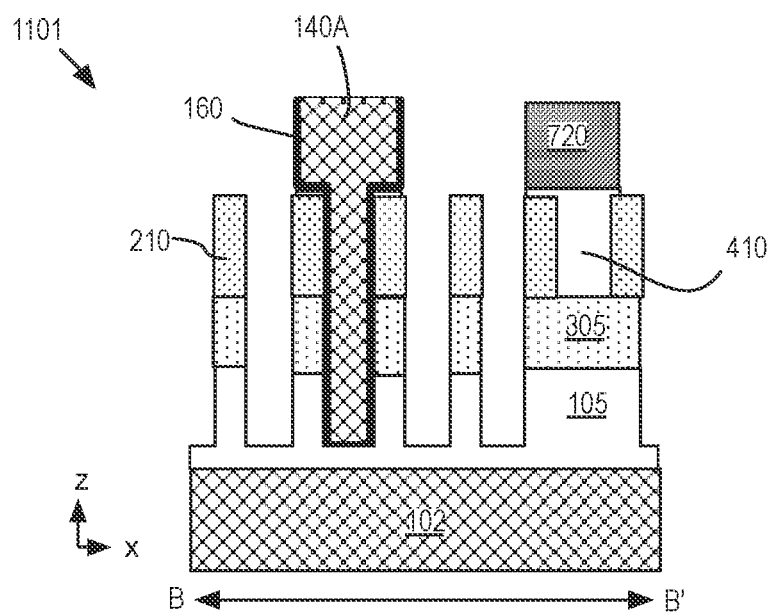
Figure 12:
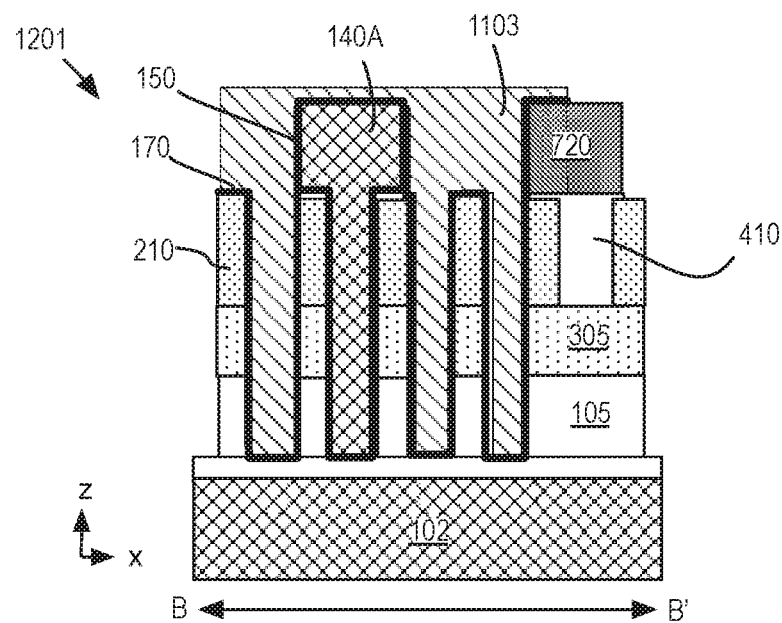

With the first line segments now formed, mask material 505 and mask cap material 410 not protected by plug mask 720 may be removed, as further shown in FIG. 10. In advantageous embodiments, mask material 505 and unprotected mask cap material 410 is removed with an etch that is selective to all remaining mask structures 210. As shown in FIG. 10, IC structure 1001 includes IC structure 901, less mask material 505 and mask cap material 410, which may, for example, have be removed with an etch process that removes mask material 505 and mask cap material 410 at a rate significantly higher than plug mask 720 and mask structures 210. Following this mask strip, the underlayer (e.g., mask layer 305) is masked by a remainder of mask structures 210 summed with plug mask 720. As long as plug mask 720 has sufficient lateral dimensions to overlap adjacent mask structures 210, the union of plug mask 720 with mask structures 210 has discrete lateral dimensions that are integer multiples of the line width L and space width S associated with the first mask level. Specifically, in FIG. 10, a union of plug mask 720 and two adjacent mask structures 210 have a lateral dimension equal to 2L+S.

Returning to FIG. 2, methods 200 continue at operation 240 where the underlayer(s) are now patterned based on a union or summation of the remaining first mask structures and residual mask cap material that was protected by the plug mask. Operation 240 may entail any etch process(es) that is(are) known to be suitable for removing unmasked portions of the underlayer(s). For example, the same etch processes employed at operation 230 may be repeated at operation 240. In some embodiments, an anisotropic trench etch having suitable selectively for the underlayer(s) relative to both the first mask structures and the cap layer residue may be employed at operation 240 to remove portions of the underlayer(s) not masked by either the first mask structures or the mask cap material residue. The resulting structures fabricated in the underlayer(s) can include both discretely-sized blocks and discretely-sized line segments of a ILD trench pattern that may be the basis for a single 2D interconnect routing level. In the example further illustrated in FIG. 11, IC structure 1101 includes IC structure 1001 following an etch of hardmask material 205 and dielectric material 105.

Returning to FIG. 2, methods 200 complete at operation 245 where the structures generated at operation 240 are further processed according to any metallization techniques known to be suitable for filling the pattern formed in the underlayer at operation 240. For example, the ILD trench pattern formed at operation 240 may be backfilled with a second metallization to form second line segments that abut the first line segments that were formed at operation 235. Continuous, non-segmented lines may also be fabricated at operation 240. One or more conductive materials may be deposited at operation 245. In some embodiments, the same metallization process employed at operation 235 is repeated at operation 245. In the example illustrated in FIG. 12, liner 170 is first deposited along a bottom and sidewall of the trench within opening 512A. Where liner 170 deposits on a sidewall of liner 160, liner 150 is formed. A fill metal is then deposited over liner 170 to complete conductive line segments 103 (e.g., line segment 103D). In some such embodiments, a Ta-based liner is deposited and Cu-based fill metal is plated over the Ta-based liner. In some other embodiments, a single homogenous material (e.g., Ru, W, etc.) is deposited during operation 245, in which case liners 150 and 170 would be absent.

Figure 13:
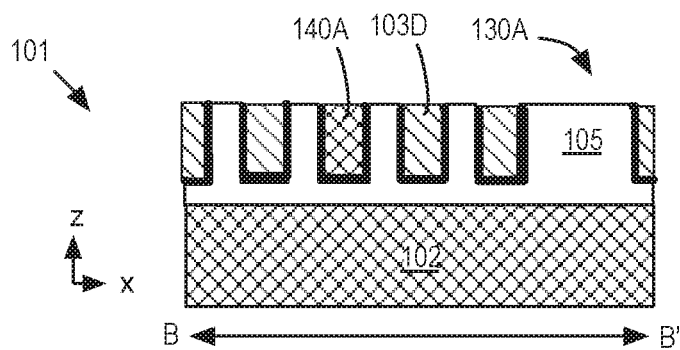

As further shown in FIG. 13, the IC structure 101 as introduced above in the context of FIGS. 1A and 1B, is generated upon the performance of any planarization process suitable for damascene or dual damascene operations. As shown in FIG. 13, metallization and dielectric over burden associated with the fabrication process is removed, for example with a chemical-mechanical planarization, leaving top surfaces of line segments 140A and 103D substantially planar with a top surface of dielectric material 105.

Although not illustrated in FIG. 13, substrate 102 may also include additional (e.g., lower) metallization interconnect layers for integrated circuits or electronic devices. Substrate 102 may also includes the electronic devices, such as transistors, memories, capacitors, resistors, optoelectronic devices, switches, or any other active or passive electronic devices.

Although methods 200 are described above in the specific context of interconnect structures for the sake of clearly conveying various aspects of the methods and highlighting structures indicative of practicing the methods, methods 200 may also be readily applied toward the fabrication of other IC structures. For example, methods 200 may be applicable to fabricating transistor terminals (e.g., gate electrodes) or other elements of an IC. It is understood that the skilled artisan should be able to apply methods 200 to any of these applications based on the interconnect embodiments described above.

Figure 14:
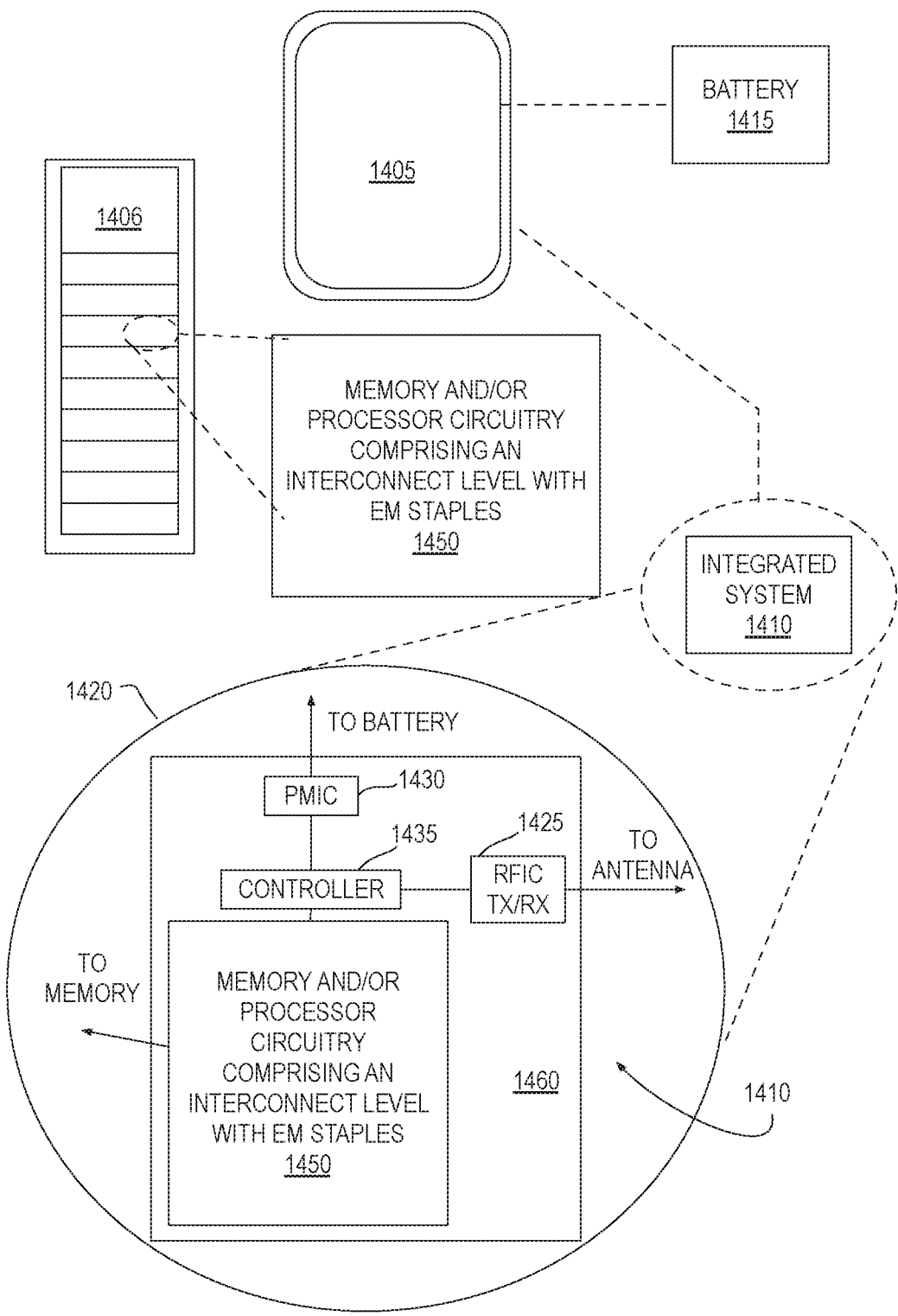
FIG. 14 illustrates a mobile computing platform and a data server machine employing an IC including interconnect lines with compositional variation, in accordance with some embodiments.

FIG. 14 illustrates a mobile computing platform and a data server machine employing an IC including electromigration-resistant scaled interconnect structures, for example including line segments with compositional variation, in accordance with embodiments described herein. The server machine 1406 may be any commercial server, for example including any number of high-performance computing platforms disposed within a rack and networked together for electronic data processing, which in the exemplary embodiment includes a packaged monolithic SoC 1450. The mobile computing platform 1405 may be any portable device configured for each of electronic data display, electronic data processing, wireless electronic data transmission, or the like. For example, the mobile computing platform 1405 may be any of a tablet, a smart phone, laptop computer, etc., and may include a display screen (e.g., a capacitive, inductive, resistive, or optical touchscreen), a chip-level or package-level integrated system 1410, and a battery 1415.

Either disposed within the integrated system 1410 illustrated in the expanded view 1420, or as a stand-alone packaged chip within the server machine 1406, monolithic SoC 1450 includes a memory circuitry block (e.g., RAM), a processor circuitry block (e.g., a microprocessor, a multi-core microprocessor, graphics processor, or the like), either or both of which include interconnect structures (e.g., line segments with compositional variation) in accordance with embodiments described herein. The monolithic SoC 1450 may be further coupled to a board, a substrate, or an interposer 1460 along with, one or more of a power management integrated circuit (PMIC) 1430, RF (wireless) integrated circuit (RFIC) 1425 including a wideband RF (wireless) transmitter and/or receiver (TX/RX) (e.g., including a digital baseband and an analog front end module further comprises a power amplifier on a transmit path and a low noise amplifier on a receive path), and a controller 1435. Any or all of RFIC 1425 and PMIC 1430 may also include interconnect structures (e.g., line segments with compositional variation), in accordance with embodiments described herein.

Functionally, PMIC 1430 may perform battery power regulation, DC-to-DC conversion, etc., and so has an input coupled to battery 1415 and with an output providing a current supply to other functional modules. As further illustrated, in the exemplary embodiment, RFIC 1425 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. Notably, each of these board-level IC modules 1425, 1430, 1435 may be integrated onto separate ICs or integrated into monolithic SoC 1450.

Figure 15:
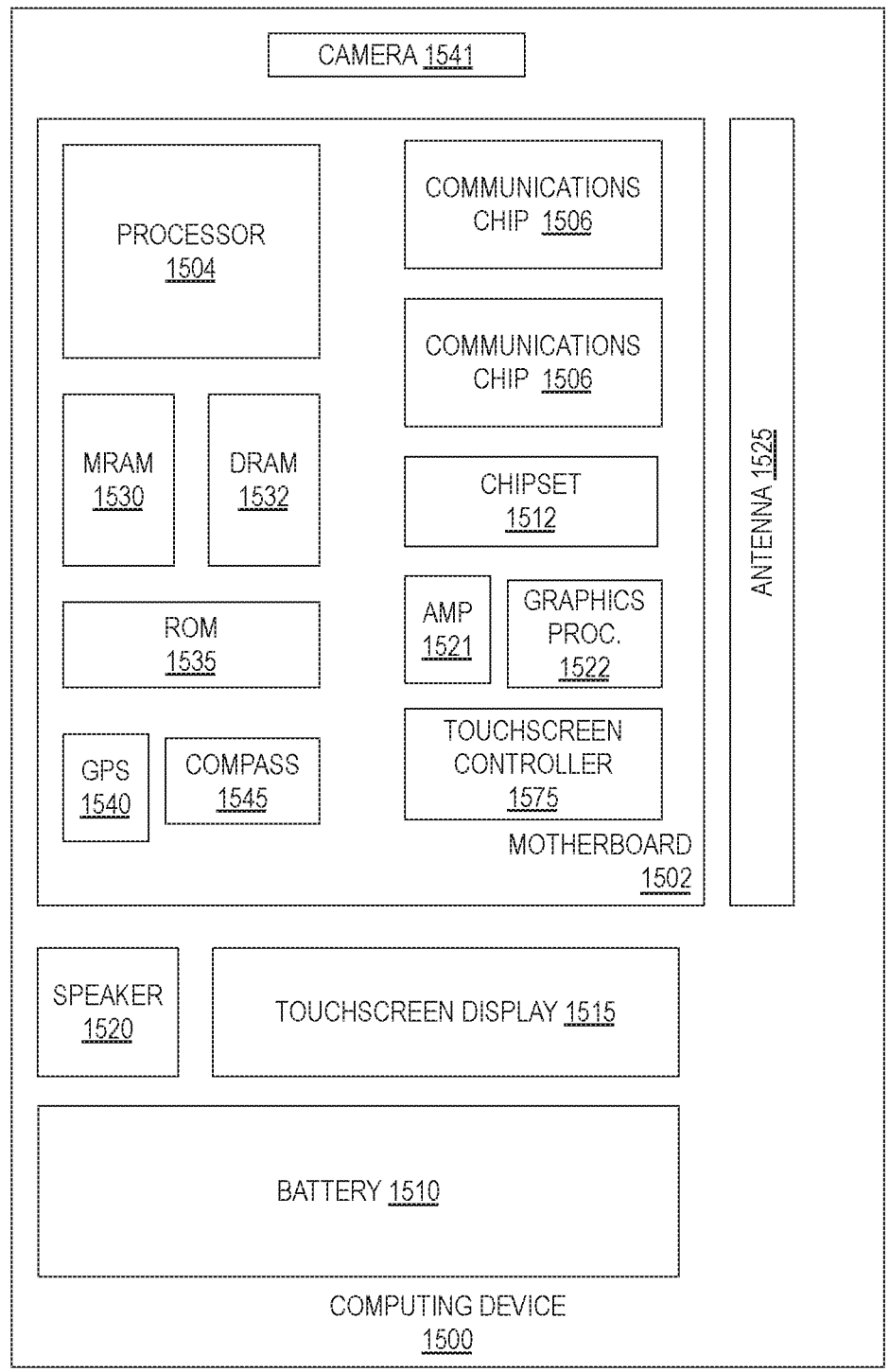
FIG. 15 is a functional block diagram of an electronic computing device, in accordance with some embodiments.

FIG. 15 is a functional block diagram of an electronic computing device 1500, in accordance with some embodiments. Computing device 1500 may be found inside platform 1405 or server machine 1406, for example. Device 1500 further includes a motherboard 1502 hosting a number of components, such as, but not limited to, a processor 1504 (e.g., an applications processor), which may further incorporate interconnect structures (e.g., line segments with compositional variation) in accordance with embodiments described herein. Processor 1504 may be physically and/or electrically coupled to motherboard 1502. In some examples, processor 1504 includes an integrated circuit die packaged within the processor 1504. In general, the term "processor" or "microprocessor" may refer to any device or portion of a device that processes electronic data from registers and/or memory to transform that electronic data into other electronic data that may be further stored in registers and/or memory.

In various examples, one or more communication chips 1506 may also be physically and/or electrically coupled to the motherboard 1502. In further implementations, communication chips 1506 may be part of processor 1504. Depending on its applications, computing device 1500 may include other components that may or may not be physically and electrically coupled to motherboard 1502. These other components include, but are not limited to, volatile memory (e.g., MRAM 1530, DRAM 1532), non-volatile memory (e.g., ROM 1535), flash memory, a graphics processor 1522, a digital signal processor, a crypto processor, a chipset, an antenna 1525, touchscreen display 1515, touchscreen controller 1575, battery 1510, audio codec, video codec, power amplifier 1521, global positioning system (GPS) device 1540, accelerometer, gyroscope, audio speaker 1520, camera 1541, and mass storage device (such as hard disk drive, solid-state drive (SSD), compact disk (CD), digital versatile disk (DVD), and so forth), or the like.

Communication chips 1506 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1506 may implement any of a number of wireless standards or protocols, including but not limited to those described elsewhere herein. As discussed, computing device 1500 may include a plurality of communication chips 1506. For example, a first communication chip may be dedicated to shorter-range wireless communications, such as Wi-Fi and Bluetooth, and a second communication chip may be dedicated to longer-range wireless communications such as GPS, EDGE. GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, an integrated circuit (IC) structure comprises a dielectric material, and an interconnect line over the dielectric material. The interconnect line comprises a first line segment having a line width. The first line segment comprises a first metal. The IC structure comprises a second line segment collinear with the first line segment. The second line segment has the line width and comprises the first metal. The IC structure comprises an intervening line segment. The intervening line segment is between an end of the first line segment and an end of the second line segment. The intervening line segment comprises a second metal, different from the first metal, abutting the first metal proximal to the ends of the first and second line segments.

In second examples, for any of the first examples the intervening line segment is a first intervening line segment between a first end of the first line segment and an end of the second line segment. The IC structure further comprises a second intervening line segment. The second intervening line segment is at a second end of the first line segment, opposite the first end. The first and second intervening line segments comprise the second metal and have the line width.

In third examples, for any of the second examples a length of the first line segment between the first and second intervening line segments is less than the Blech Length associated with a first material comprising the first metal, and a current carrying cross-sectional area of the first line segment.

In fourth examples, for any of the second through third examples the first interconnect line further comprises a third interconnect line segment collinear with the first and second line segments and having the line width. The third line segment comprises the first metal, and the second intervening line segment is between the second end of the first line segment and an end of the third line segment.

In fifth examples, for any of the first through the fourth examples the first metal is within a first material having a lower electromigration activation energy than a second material comprising the second metal.

In sixth examples, for any of the fifth examples the first metal is Cu and the second metal is Ta.

In seventh examples, for any of the sixth examples the intervening interconnect line segment comprises a fill material separated from the dielectric material, and separated from the first metal, by the second metal.

In eighth examples, for any of the second through the seventh examples, the first and second intervening interconnect line segments are a barrier layer in contact with the first metal over an entire current-carrying cross-sectional area of the first line segment.

In ninth examples, for any of the eighth examples the barrier layer has a thickness that is equal to twice a thickness of another barrier layer that is between the first metal and the dielectric material.

In tenth examples, for any of the first through the ninth examples, the interconnect line is a first interconnect line and the structure further comprises a second interconnect line over the dielectric material and adjacent to the first interconnect line. The second interconnect line comprises a single line segment having a length equal to a sum of a length of the first line segment, a length of second line segment, and a length of the first intervening line segment. The second interconnect line comprises the first metal.

In eleventh examples, for any of the tenth examples the IC structure further comprises a plurality of transistors. The first interconnect line is coupled to a source of one of the transistors, and the second interconnect line is coupled to a gate of one of the transistors.

In twelfth examples, for any of the first through the eleventh examples, a top surface of the intervening line segments is coplanar with a top surface of the first, second and third line segments.

In thirteenth examples, an integrated circuit (IC) device comprises a plurality of transistors, ones of the transistors comprising one or more layers of semiconductor material. The IC device comprises plurality of interconnect levels coupling together the transistors. One or more of the plurality of the interconnect levels further comprise an interconnect line over a dielectric material, wherein the interconnect line comprises a first line segment having a line width. The first line segment comprises a first metal. A second line segment is collinear with the first line segment. The second line segment has the line width and comprises the first metal. An intervening line segment is abutting a first end of the first line segment. The intervening line segment is between the first end of the first line segment and an end of the second line segment. The intervening line segment comprise a second metal, different than the first metal.

In fourteenth examples, for any of the thirteenth examples, the IC device comprises a second intervening line segment. The second intervening interconnect line segment abuts a second end of the first line segment, opposite the first end. The intervening line segment has the line width, and the second intervening line segment has the line width. An interconnect fill material comprises the first metal, and an interconnect barrier layer comprises the second metal. The intervening interconnect line segments comprise the interconnect barrier layer.

In fifteenth examples, for any of the fourteenth examples the interconnect line further comprises a third interconnect line segment collinear with the first and second line segments and having the line width. The third line segment comprises the first metal. The second intervening line segment is between the second end of the first line segment and an end of the third line segment.

In sixteenth examples, a computer platform comprises a data storage means to store data, and a data processing means coupled to the data storage means. The data processing means includes the IC structure of any of the first through the twelfth examples.

In seventeenth examples, the computer platform further comprises a battery coupled to the data processing means. A wireless communication means is coupled to the data processing means.

In eighteenth examples, a method of fabricating an integrated circuit (IC) structure comprises receiving a workpiece with a line pattern in a first mask layer, the line pattern comprising a plurality of lines, each of the lines having a width and separated from adjacent lines by a space. The method comprises backfilling the first mask layer with a surrounding material, and patterning a first opening and a second opening in a second mask layer over the backfilled first mask layer. The first opening has a smaller lateral dimension than the second opening. The method comprises depositing a thin film over sidewalls of the second mask layer, the thin film reducing the lateral dimension of the second opening and completely occluding the first opening to form a plug mask, and etching the thin film to expose a top surface of the second mask layer. The method comprises removing the surrounding material from at least one of the spaces between the lines of the first mask layer within the second opening, and etching first recess in an underlying dielectric material where the dielectric material is not protected by the plug mask or a remainder of the backfilled line pattern. The method comprises backfilling the first recess with a first conductive material that comprises a first metal and stripping the second mask layer and surrounding material from the remaining spaces between the lines of the first mask layer. The method comprises etching second recess in the underlying dielectric material where the dielectric material is not protected by the plug mask, first conductive material, or lines of the first mask layer, and forming collinear interconnect line segments by backfilling the second recess with a second conductive material that comprises a second metal, different than the first metal.

In nineteenth examples, for any of the eighteenth examples the method comprises removing the surrounding material from at least one of the spaces opens only one of the spaces selectively to two adjacent lines of the first mask layer, and backfilling the first recess with the first conductive material comprises depositing a barrier layer over a sidewall of the ILD layer, and depositing a fill metal over the barrier layer.

In twentieth examples, for any of the eighteenth through nineteenth examples backfilling the second recess with the second conductive material comprises depositing a second barrier layer over a sidewall of the dielectric material, and depositing a second fill metal over the second barrier layer.

In twenty-first examples, for any of the twentieth examples the first and second barrier layers have the same composition and the first and second fill metals have the same composition.

In twenty-second examples, for any of the eighteenth through twentieth examples, the second opening has a lateral width at least equal to a lateral width of one of the spaces summed with twice a thickness of the thin film deposited over the sidewalls of the second mask layer.

In twenty-third examples, for any of the eighteenth through twenty-second examples the first opening has a minimum lateral width no larger than twice the thickness of the thin film.

In twenty-fourth examples, for any of the eighteenth through twenty-third examples etching the thin film to expose the top surface of the second mask layer further comprises an anisotropic etch of the thin film, the anisotropic etch leaving sidewall spacers along a sidewall of the second opening.

In twenty-fifth examples, for any of the eighteenth through twenty-fourth examples the method further comprises removing the sidewall spacers before removing the surrounding material from at least one of the spaces between the lines of the first mask layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   one or more dielectric materials; and
   an interconnect line extending a length over the one or more dielectric materials, wherein the interconnect line, within the length, comprises:
      a first line segment comprising a first metal and having a line width;
      a second line segment collinear with the first line segment, wherein the second line segment comprises the first metal and has the line width; and
      an intervening line segment, wherein the intervening line segment is between an end of the first line segment and an end of the second line segment, wherein the intervening line segment comprises a second metal, different from the first metal, abutting the first metal proximal to the ends of both the first and second line segment, and wherein the intervening line segment has a width substantially equal to the line width.

2. The IC structure of claim 1, wherein the intervening line segment is a first intervening line segment between a first end of the first line segment and an end of the second line segment; and
   further comprising a second intervening line segment, wherein the second intervening line segment is at a second end of the first line segment, opposite the first end, and wherein the first and second intervening line segments comprise the second metal and have substantially the line width.

3. The IC structure of claim 2, wherein a length of the first line segment between the first and second intervening line segments is less than the Blech Length associated with a first material comprising the first metal, and a current carrying cross-sectional area of the first line segment.

4. The IC structure of claim 2, wherein the interconnect line further comprises a third line segment collinear with the first and second line segments and having the line width, wherein the third line segment comprises the first metal, wherein the second intervening line segment is between the second end of the first line segment and an end of the third line segment and wherein the first and second intervening line segments have a same vertical height and substantially the same width as the first, second and third line segments.

5. The IC structure of claim 1, wherein the first metal is within a first material having a lower electromigration activation energy than a second material comprising the second metal.

6. The IC structure of claim 5, wherein the first metal is Cu and the second metal is Ta.

7. The IC structure of claim 6, wherein the second material is in contact with the first material over an entire current-carrying cross-sectional area of the first line segment.

8. The IC structure of claim 7, wherein the second material in contact with the first material over the entire current-carrying cross-sectional area of the first line segment has a thickness that is equal to twice a thickness of the second material that is between the first metal and the one or more dielectric materials.

9. The IC structure of claim 5, wherein the intervening line segment also comprises the first material separated from the one or more dielectric materials by the second material, and separated from the first material of the first and second line segments by the second material, and wherein a first portion of the length occupied by the first material of the intervening line segment is approximately equal to a second portion of the length occupied by the first material of the first and second line segments.

10. The IC structure of claim 1, wherein the interconnect line is a first interconnect line and the structure further comprises a second interconnect line over the one or more dielectric materials and adjacent to the first interconnect line, wherein:
the second interconnect line comprises a single line segment having a length equal to a sum of a length of the first line segment, a length of second line segment, and a length of the intervening line segment; and
the second interconnect line comprises the first metal.

11. A computer platform, comprising:
a storage device to store data; and
a processor coupled to the storage device, wherein the processor comprises the IC structure of claim 1.

12. The computer platform of claim 11, further comprising:
a power supply coupled to the processor; and
a wireless communication IC coupled to the processor.

13. An integrated circuit (IC) device, comprising:
a plurality of transistors, individual ones of the transistors comprising one or more layers of semiconductor material; and
a plurality of interconnect levels coupling together the transistors, wherein one or more of the interconnect levels further comprise:
an interconnect line extending a length over one or more dielectric materials, wherein the interconnect line, within the length, comprises:
a first line segment comprising a first metal and having a line width;
a second line segment collinear with the first line segment, wherein the second line segment comprises the first metal and has the line width; and
an intervening line segment abutting a first end of the first line segment, wherein the intervening line segment is between the first end of the first line segment and an end of the second line segment;
wherein:
the intervening line segment comprises a second metal, different than the first metal, abutting the first metal proximal to the ends of both the first and second line segments;
the intervening line segment also comprises the first metal separated from the one or more dielectric materials by the second metal; and
a first portion of the length occupied by the first metal of the intervening line segment is approximately equal to a second portion of the length occupied by the first metal of the first and second line segments.

14. The IC device of claim 13, further comprising:
a second intervening line segment, wherein the second intervening line segment abuts a second end of the first line segment, opposite the first end, and wherein:
the intervening line segment has a width substantially equal to the line width, and the second intervening line segment has a width substantially equal to the line width;
an interconnect fill material comprises the first metal, and an interconnect barrier layer comprises the second metal; and
the intervening line segments comprise the interconnect barrier layer.

15. The IC device of claim 14, wherein the interconnect line further comprises a third line segment collinear with the first and second line segments and having the line width, wherein the third line segment comprises the first metal, and wherein the second intervening line segment is between the second end of the first line segment and an end of the third line segment.

16. A method of fabricating an integrated circuit (IC) structure, comprising:
receiving a workpiece with a line pattern in a first mask layer, the line pattern comprising a plurality of lines, each of the lines having a width and separated from an adjacent line by a space;
backfilling the first mask layer with a surrounding material;
patterning a first opening and a second opening in a second mask layer over the backfilled first mask layer, wherein the first opening has a smaller lateral dimension than the second opening;
depositing a thin film over sidewalls of the second mask layer, the thin film reducing the lateral dimension of the second opening and completely occluding the first opening to form a plug mask;
etching the thin film to expose a top surface of the second mask layer;
removing the surrounding material from at least one of the spaces between the lines of the first mask layer within the second opening;
etching a first recess into an underlying dielectric material where the dielectric material is not protected by the plug mask or a remainder of the backfilled line pattern;
backfilling the first recess with a first conductive material that comprises a first metal;
stripping the second mask layer and the surrounding material from the remaining spaces between the lines of the first mask layer;

etching a second recess into the underlying dielectric material where the dielectric material is not protected by the plug mask, first conductive material, or lines of the first mask layer; and forming collinear interconnect line segments by backfilling the second recess with a second conductive material that comprises a second metal, different than the first metal.

17. The method of claim 16, wherein:

removing the surrounding material from at least one of the spaces opens only one of the spaces selectively to two adjacent lines of the first mask layer; and backfilling the first recess with the first conductive material comprises depositing a barrier layer over a sidewall of the dielectric material, and depositing a fill metal over the barrier layer.

18. The method of claim 17, wherein backfilling the second recess with the second conductive material comprises depositing a second barrier layer over a sidewall of the dielectric material, and depositing a second fill metal over the second barrier layer.

19. The method of claim 16, wherein the first metal is Cu and the second metal is Ta.

20. The method of claim 16, wherein the first and second recesses have substantially the same width.

* * * * *